(12) United States Patent
Lin et al.

(10) Patent No.: US 12,309,960 B2
(45) Date of Patent: May 20, 2025

(54) ELECTRONIC DEVICE AND BRACKET THEREOF

(71) Applicant: Wistron Corp., New Taipei (TW)

(72) Inventors: Wei Lin, New Taipei (TW); Yu-Jian Wu, New Taipei (TW); Chia-hsin Liu, New Taipei (TW)

(73) Assignee: Wistron Corp., New Taipei (TW)

( * ) Notice: Subject to any disclaimer, the term of this patent is extended or adjusted under 35 U.S.C. 154(b) by 341 days.

(21) Appl. No.: 17/986,776

(22) Filed: Nov. 14, 2022

(65) Prior Publication Data
US 2024/0064923 A1 Feb. 22, 2024

(30) Foreign Application Priority Data
Aug. 19, 2022 (CN) .......................... 202210997851.2

(51) Int. Cl.
*H05K 7/14* (2006.01)

(52) U.S. Cl.
CPC ......... *H05K 7/1489* (2013.01); *H05K 7/1487* (2013.01)

(58) Field of Classification Search
None
See application file for complete search history.

(56) References Cited

U.S. PATENT DOCUMENTS

| 7,190,574 | B2 * | 3/2007 | Muenzer | G06F 1/184 |
| | | | | 361/679.33 |
| 7,200,003 | B2 * | 4/2007 | Hood | G06F 1/184 |
| | | | | 361/679.33 |
| 10,264,701 | B1 * | 4/2019 | Norton | H05K 7/1424 |

FOREIGN PATENT DOCUMENTS

| CN | 208159069 U | 11/2018 |
| TW | I614596 B | 2/2018 |
| TW | M595869 U | 5/2020 |

* cited by examiner

*Primary Examiner* — James Wu
*Assistant Examiner* — Christopher L Augustin

(57) ABSTRACT

An electronic device is provided. The electronic device includes a first connection module, a second connection module and a case. The first connection module includes a plurality of first brackets, wherein the first brackets are stacked in a first direction. The second connection module includes a plurality of second brackets, wherein the second brackets are arranged side by side in a second direction, and the first direction is perpendicular to the second direction. The case is selectively connected to the first connection module or the second connection module. The case can receive the storage units of different sizes.

19 Claims, 23 Drawing Sheets

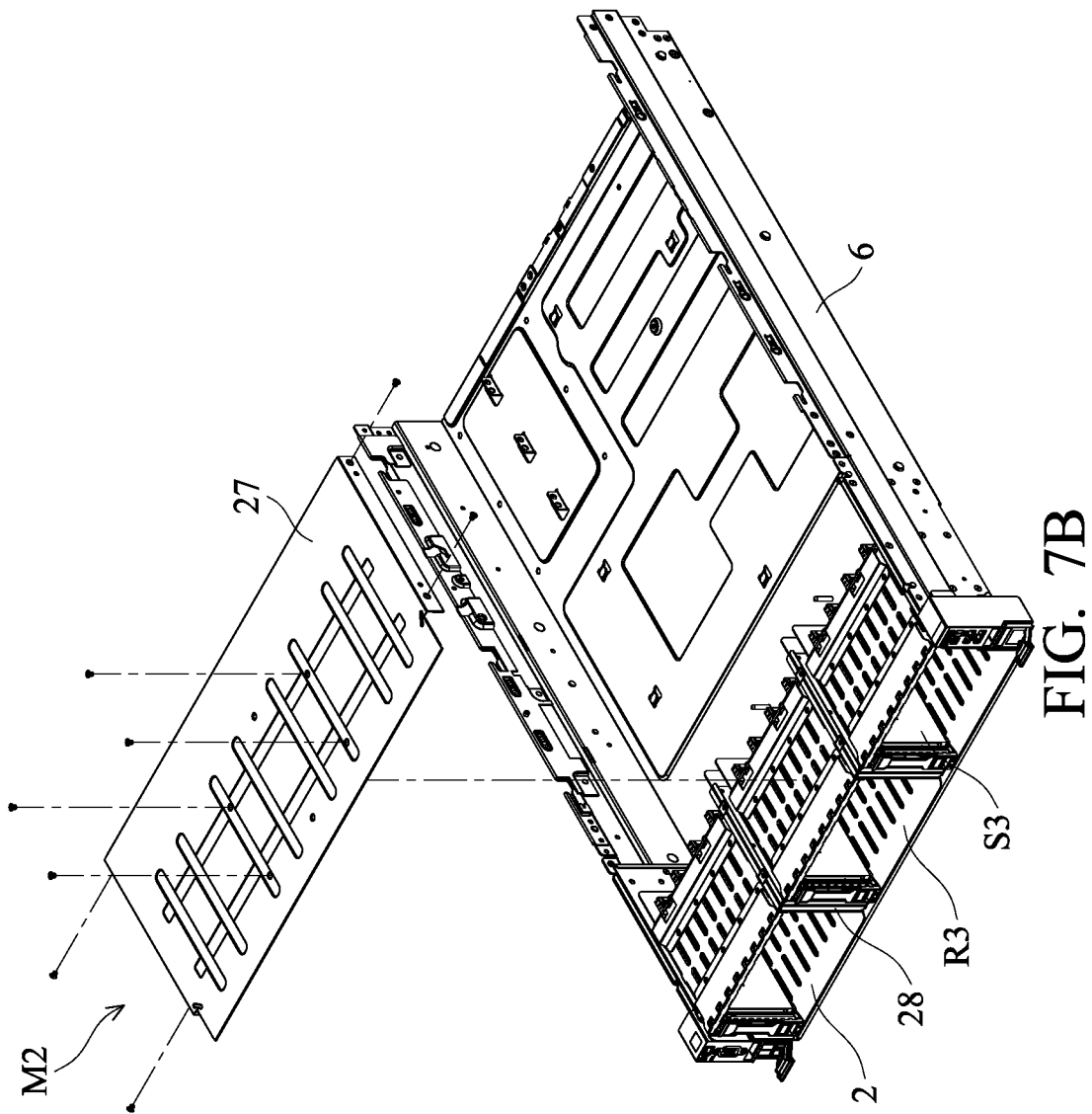

ELECTRONIC DEVICE AND BRACKET THEREOF

CROSS REFERENCE TO RELATED APPLICATIONS

This application claims priority of China Patent Application No. 202210997851.2, filed on Aug. 19, 2022, the entirety of which is incorporated by reference herein.

BACKGROUND OF THE INVENTION

Field of the Invention

The present invention relates to an electronic device, and in particular to an electronic device capable to receive storage units of different sizes.

Description of the Related Art

The storage units utilized in a conventional server include 3.5" hard drives, 2.5" hard drives, optical disk drives, SFF (Small Form Factor) solid state drives, and EDSFF (Enterprise & Data Small Form Factor) solid state drives. Conventionally, one single server contains many storage units of the same specifications. However, the storage units of different specifications have different sizes. A conventional server case cannot contain storage units of different specifications, and a tailored server case is required. Tailored server cases raise the cost of manufacturing the server.

BRIEF SUMMARY OF THE INVENTION

Embodiments of the invention are provided to address the aforementioned difficulty.

In one embodiment, an electronic device is provided. The electronic device includes a first connection module, a second connection module and a case. The first connection module includes a plurality of first brackets, wherein the first brackets are stacked in a first direction. The second connection module includes a plurality of second brackets, wherein the second brackets are arranged side by side in a second direction, and the first direction is perpendicular to the second direction. The case is selectively connected to the first connection module or the second connection module.

In one embodiment, an electronic device is provided. The electronic device includes a case, a connection module and a storage unit. The connection module is detachably connected to the case. The storage unit is disposed in the connection module and electrically connected to the connection module, wherein the storage unit is selectively connected to the connection module in a first direction or a second direction.

In one embodiment, a bracket is provided. The bracket includes a first moveable plate, a first moveable cover, a second moveable plate, a second moveable cover and a bracket body. The bracket body includes a first sliding groove and a second sliding groove, wherein the height of the first sliding groove differs from the height of the second sliding groove, the first sliding groove is connected to the first moveable cover, the second sliding groove is connected to the second moveable cover, the bracket body is selectively connected to the first moveable plate and the first moveable cover, or connected to the second moveable plate and the second moveable cover.

In the embodiment of the invention, one single case is combined with the first brackets and the second brackets of different design to selectively receive the different storage units such as the 3.5" hard drives, the 2.5" hard drives, the optical disk drives, the SFF (Small Form Factor) solid state drives and the EDSFF (Enterprise & Data Small Form Factor) solid state drives. Therefore, the molding manufacturing cost of the case is decreased, the product (electronic device, for example, server) can utilize different storage units unrestrictedly, and the product competitiveness is improved.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 7B shows a second cover of the embodiment of the invention;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
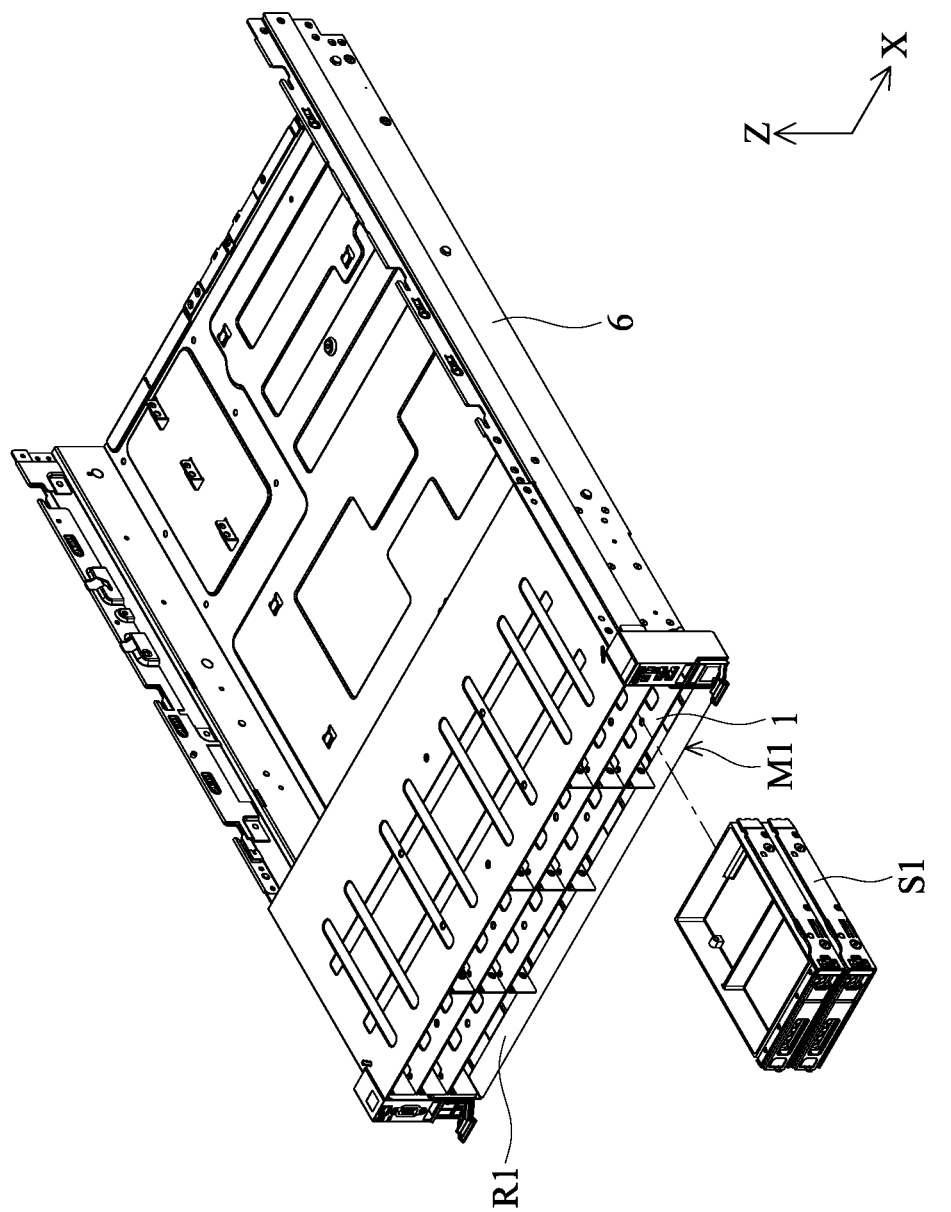
FIG. 1A shows an electronic device of the embodiment of the invention, wherein the case is connected to the first connection module.
Figure 1B:
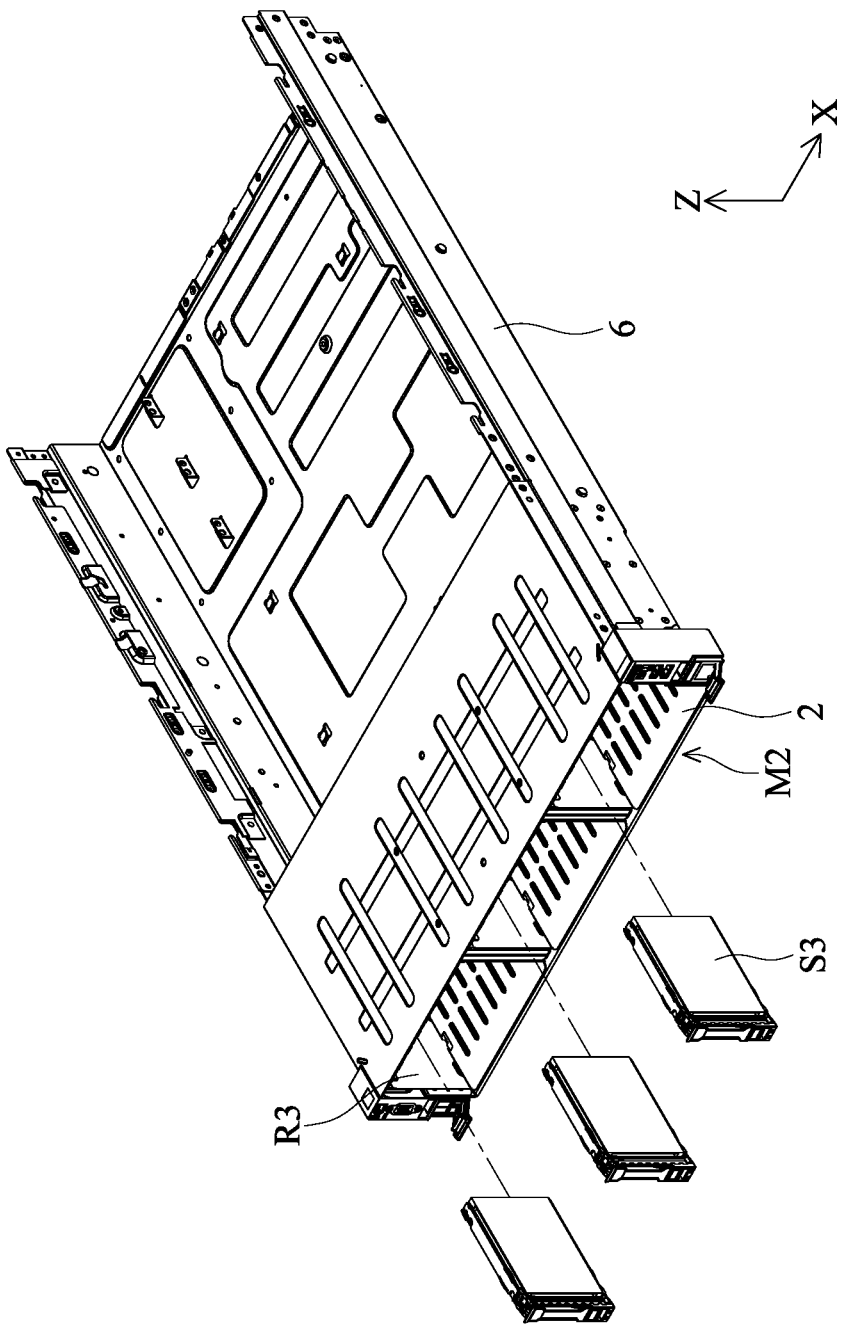
FIG. 1B shows an electronic device of the embodiment of the invention, wherein the case is connected to the second connection module.

FIG. 1A shows an electronic device of the embodiment of the invention, wherein the case is connected to the first connection module. FIG. 1B shows an electronic device of the embodiment of the invention, wherein the case is connected to the second connection module. With reference to FIGS. 1A and 1B, in one embodiment, an electronic device is provided. The electronic device includes a first connection module M1, a second connection module M2 and a case 6. The first connection module M1 includes a plurality of first brackets 1. The first brackets 1 are stacked in a first direction (Z direction). The second connection module M2 includes a plurality of second brackets 2. The second brackets 2 are arranged side by side in a second direction (X direction). The first direction is perpendicular to the second direction. The case 6 is selectively connected to the first connection module M1 or the second connection module M2.

Figure 2A:
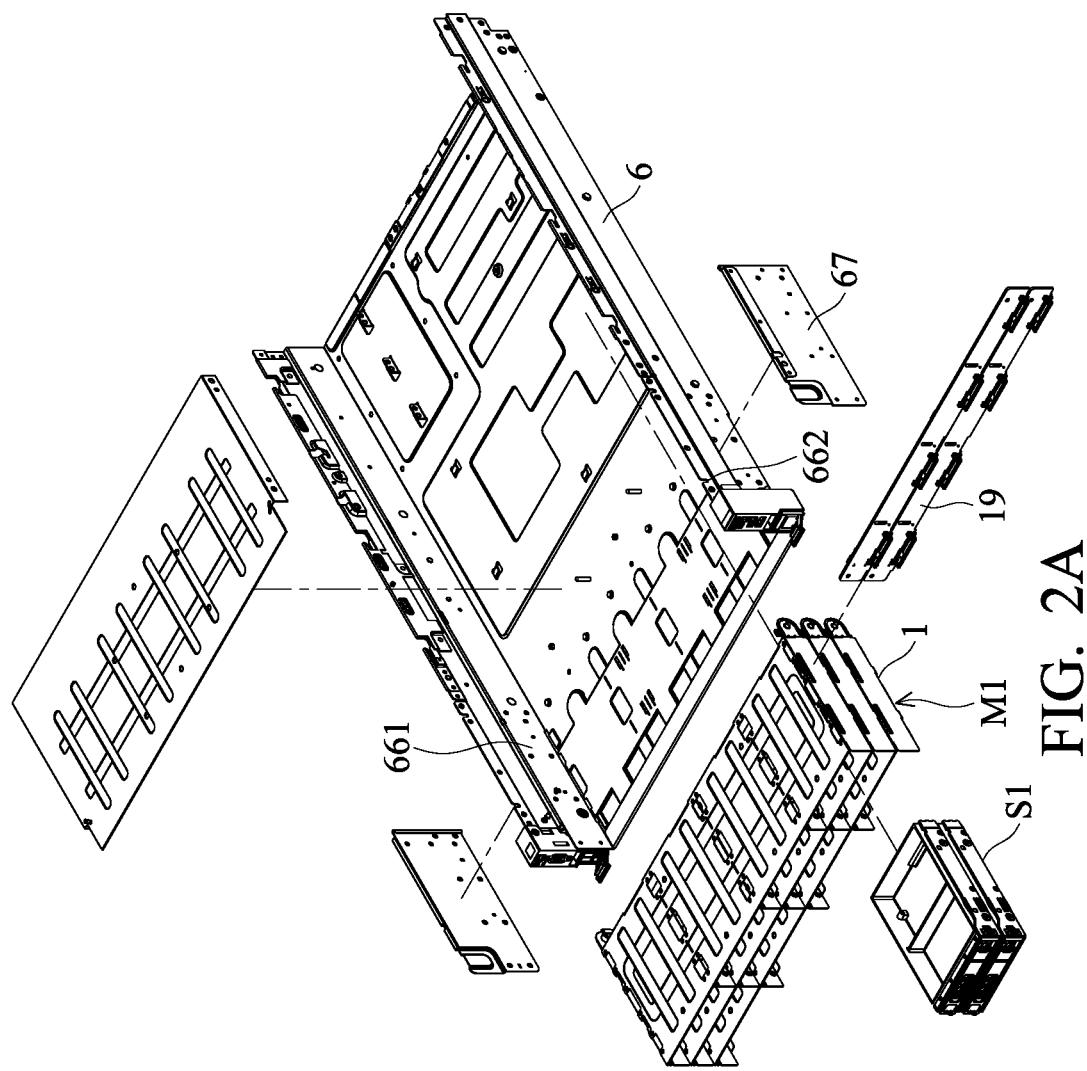
FIG. 2A is an exploded view of the electronic device of the embodiment of the invention, wherein the case is connected to the first connection module.

FIG. 2A is an exploded view of the electronic device of the embodiment of the invention, wherein the case is connected to the first connection module. With reference to FIG. 2A, in one embodiment, the case 6 comprises a first side 661 and a second side 662. The width of each first bracket 1 extends from the first side 661 to the second side 662 in the X direction. The first brackets 1 are affixed to the case 6. The first storage unit S1 is disposed in the first bracket 1. The first brackets 1 are stacked up.

With reference to FIG. 2A, in one embodiment, the first connection module M1 further comprises a plurality of first back plates 19. Each first back plate 19 is connected to each first bracket 1. The storage unit S1 is electrically connected to the first back plate 19.

Figure 2B:
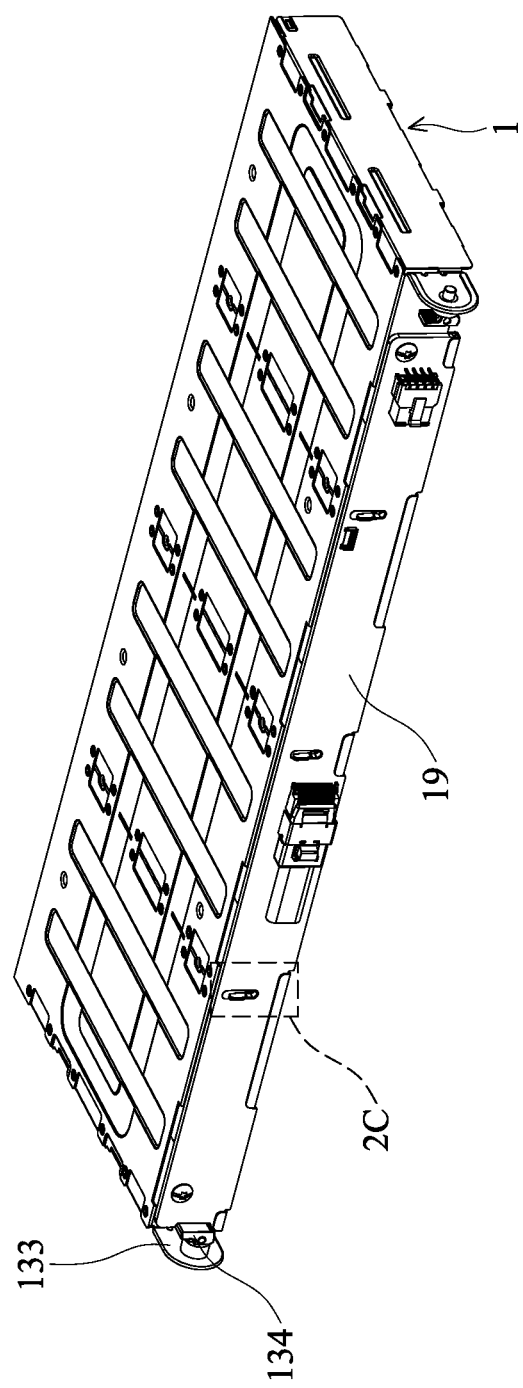
FIG. 2B shows the first back plate of the embodiment of the invention.
Figure 2C:
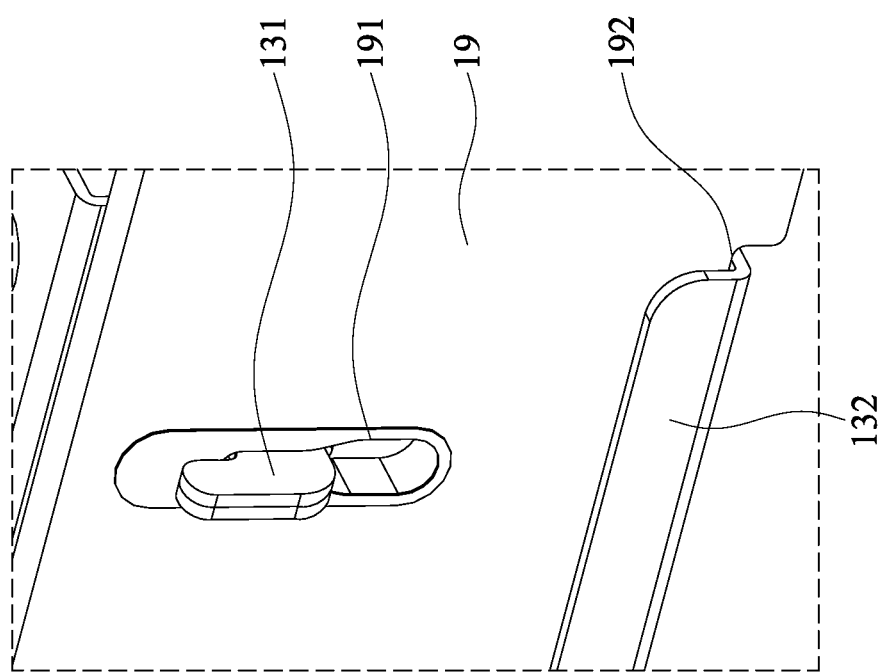
FIG. 2C is an enlarged view of the portion 2C of FIG. 2B.

FIG. 2B shows the first back plate of the embodiment of the invention. FIG. 2C is an enlarged view of the portion 2C of FIG. 2B. With reference to FIGS. 2B and 2C, in one embodiment, the first bracket 1 comprises a first bracket hook 131. Each first back plate 19 comprises a first plate slot 191. The first bracket hook 131 is wedged against the first plate slot 191.

With reference to FIGS. 2B and 2C, in one embodiment, each first bracket 1 comprises a first bracket restriction portion 132. One edge 192 of each first back plate 19 is restricted by the first bracket restriction portion 132. In this embodiment, the first back plate 19 is affixed to the first bracket 1 by bolts (not shown).

With reference to FIG. 2A, in one embodiment, the electronic device comprises a case bracket 67. The case bracket 67 is disposed inside the case 6, and is a portion of the case 6. In one embodiment, the case bracket 67 can be integrally formed with the case 6. The disclosure is not meant to restrict the invention.

Figure 3A:
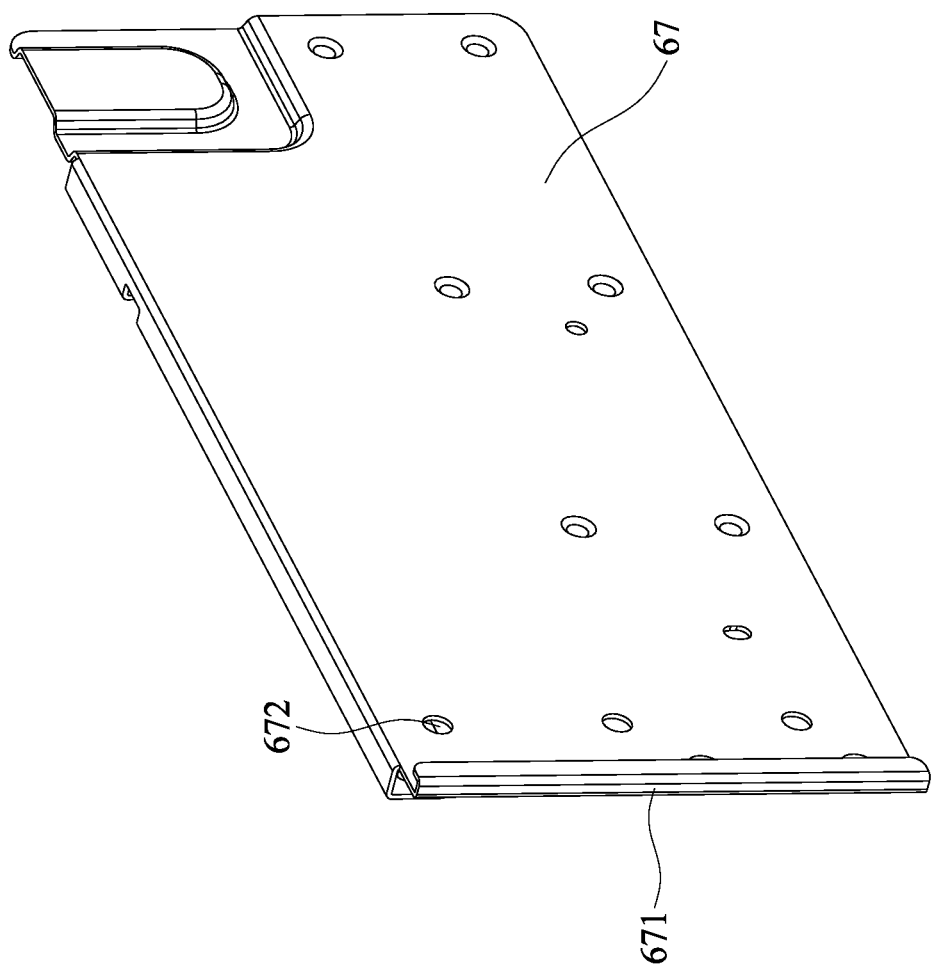
FIG. 3A shows the details of the case bracket of the embodiment of the invention.
Figure 3B:
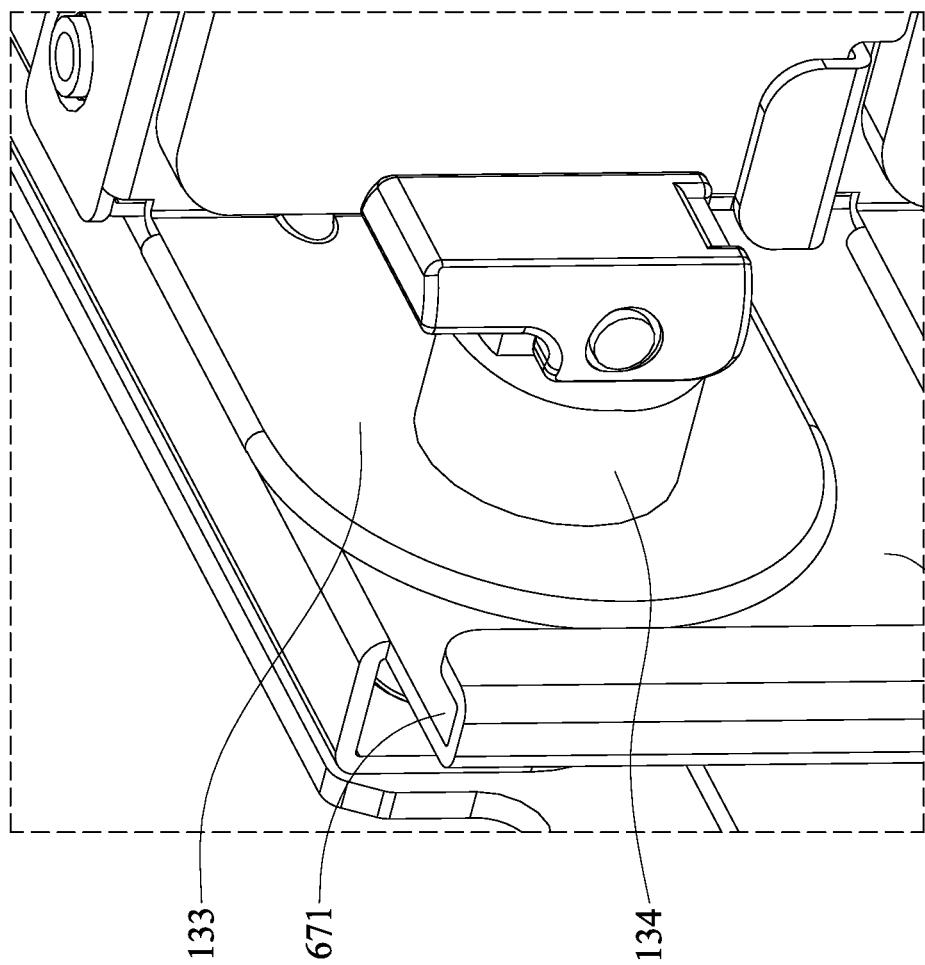
FIG. 3B shows the first bracket of the embodiment of the invention connected to the case bracket.

FIG. 3A shows the details of the case bracket of the embodiment of the invention. FIG. 3B shows the first bracket of the embodiment of the invention connected to the case bracket. With reference to FIGS. 2B, 3A and 3B, in one embodiment, each first bracket 1 comprises a bracket protrusion 133 and a first moveable latch 134. The first moveable latch 134 is disposed on the bracket protrusion 133. The case bracket 67 of the case comprises a case guiding groove 671 and a first case positioning hole 672. The bracket protrusion 133 is adapted to slide in the case guiding groove 671. The first moveable latch 134 is adapted to be inserted into the first case positioning hole 672 to position the first bracket 1.

Figure 4A:
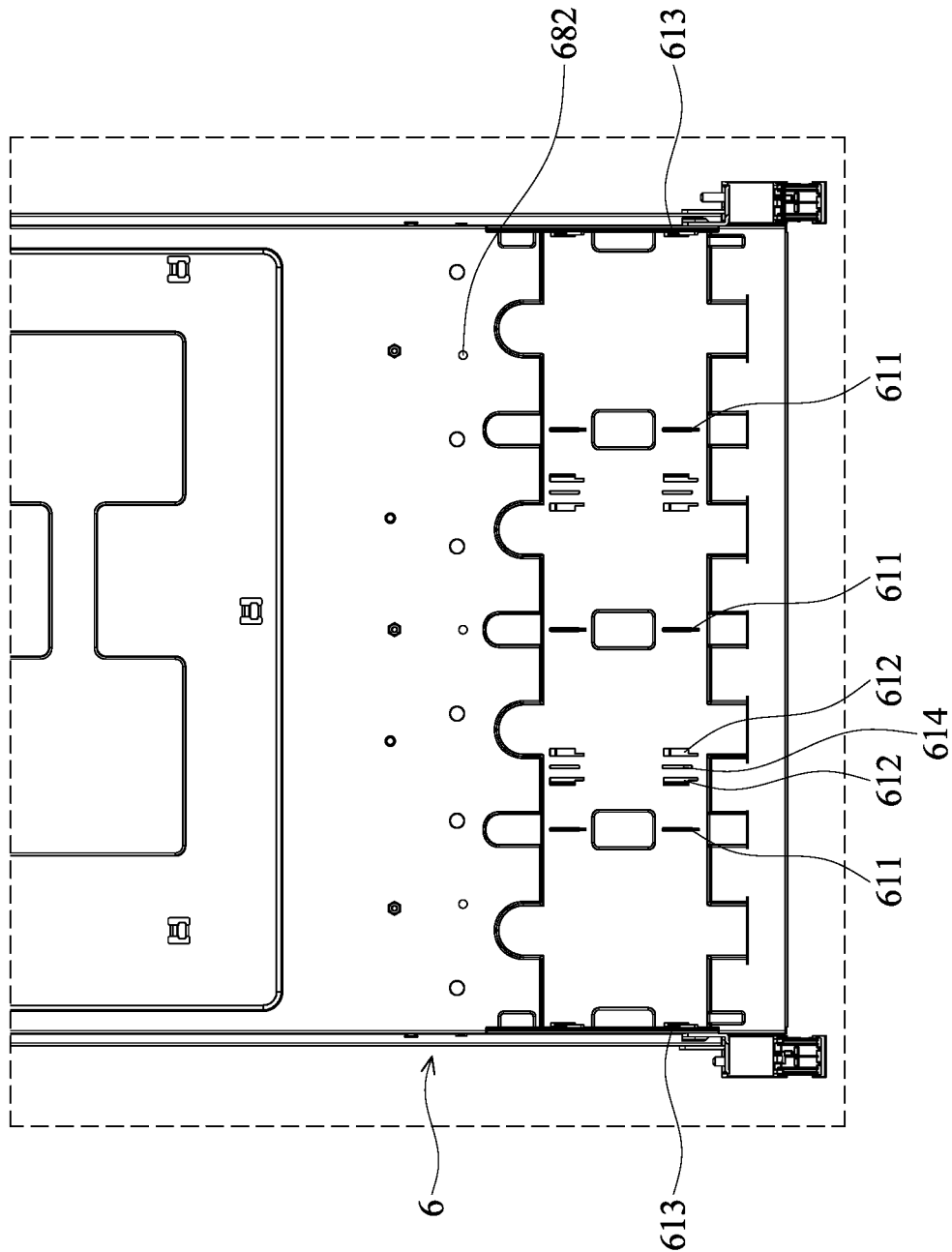
FIG. 4A shows the details of the case of the embodiment of the invention.
Figure 4B:
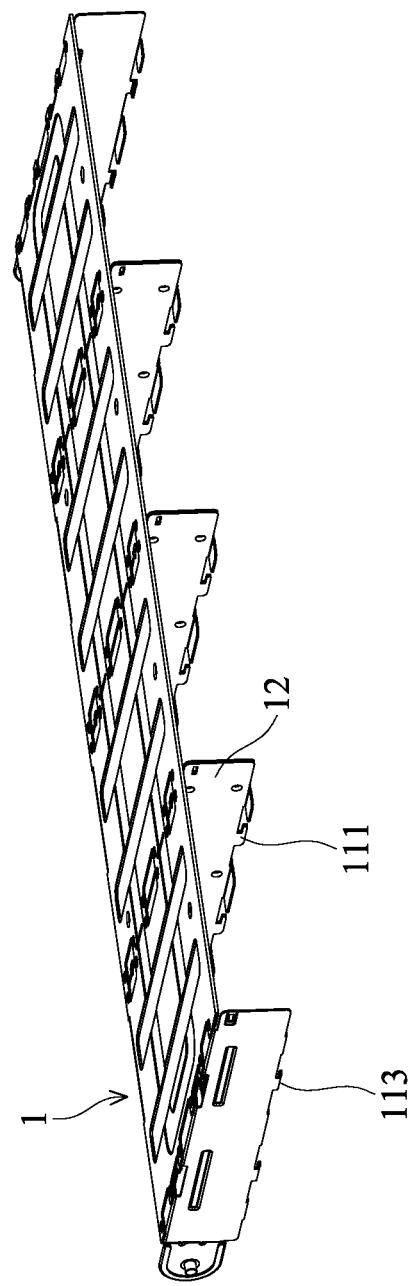
FIG. 4B shows the hooks of the first bracket of the embodiment of the invention.

FIG. 4A shows the details of the case of the embodiment of the invention. FIG. 4B shows the hooks of the first bracket of the embodiment of the invention. With reference to FIGS. 4A and 4B, in one embodiment, the case 6 comprises two case lateral slots 613 and a first case connection slot 611. The first case connection slot 611 is located between the case lateral slots 613. In another embodiment, the case 6 comprises two case lateral slots 613 and a plurality of first case connection slots 611. The first case connection slots 611 are located between the case lateral slots 613. Each first bracket 1 comprises two first lateral hooks 113 and a first connection hook 111. The first lateral hooks 113 are adapted to be connected to the case lateral slots 613. The first connection hook 111 is adapted to be connected to the first case connection slot 611.

With reference to FIG. 4B, in one embodiment, each first bracket 1 comprises a spacer 12. The first connection hook 111 is formed on the spacer 12.

Figure 4C:
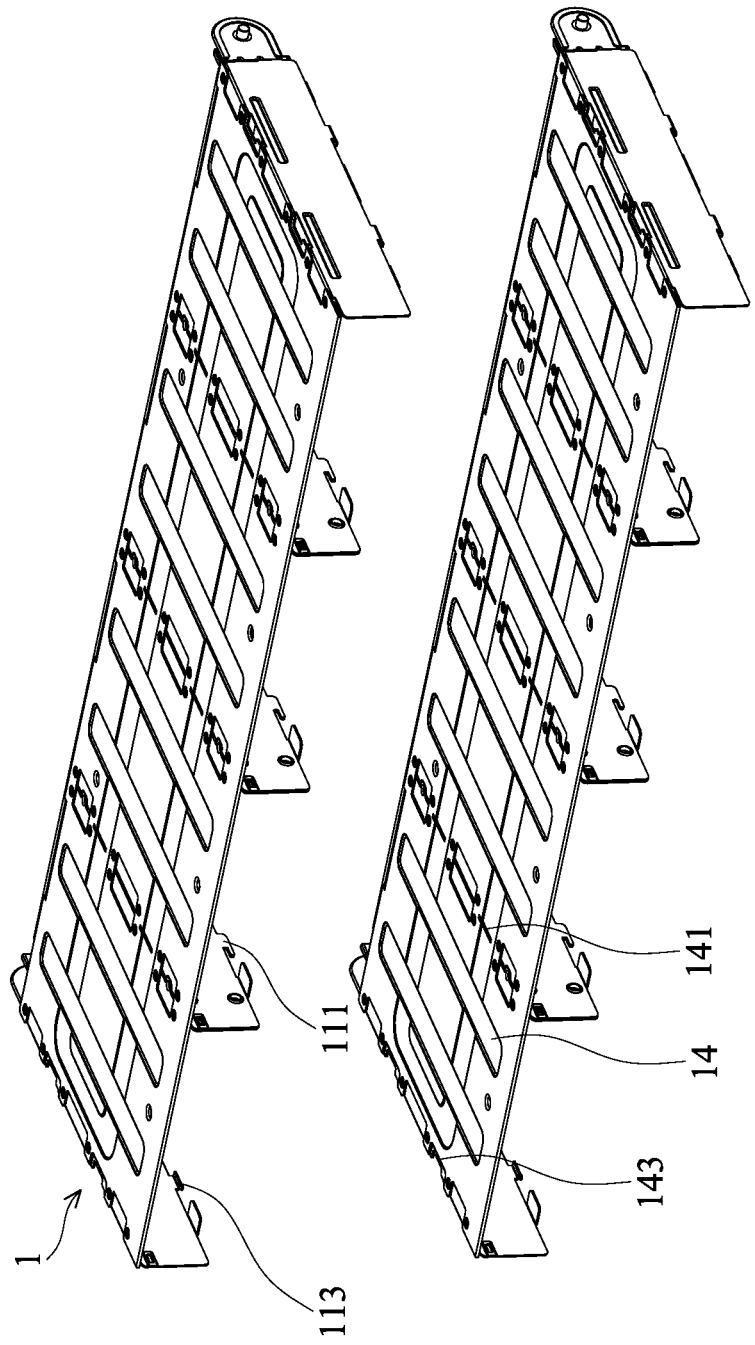
FIG. 4C shows the first bracket of the embodiment of the invention connected to each other.

FIG. 4C shows the first bracket of the embodiment of the invention connected to each other. With reference to FIG. 4C, in one embodiment, each first bracket 1 comprises a first cover 14. Two first cover lateral slots 143 and a first cover connection slot 141 are formed on the first cover 14. In one embodiment, two first cover lateral slots 143 and a plurality of first cover connection slots 141 are formed on the first cover 14. When the first brackets 1 are stacked on top of each other, the first lateral hooks 113 are adapted to be connected to the first cover lateral slots 143, and the first connection hook 111 is adapted to be connected to the first cover connection slot 141.

Figure 5:
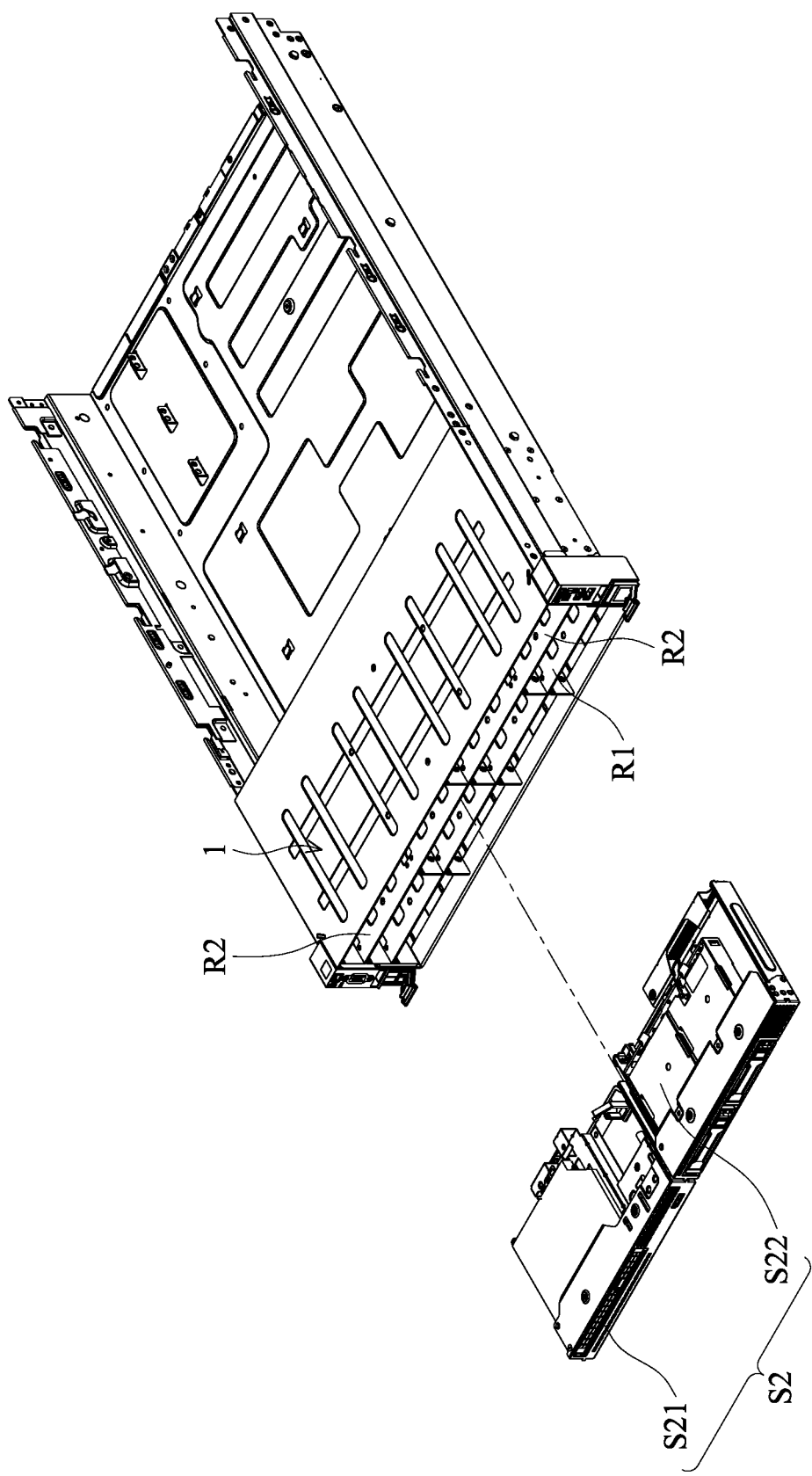
FIG. 5 shows the first connection module of a modified example of the invention.
Figure 6A:
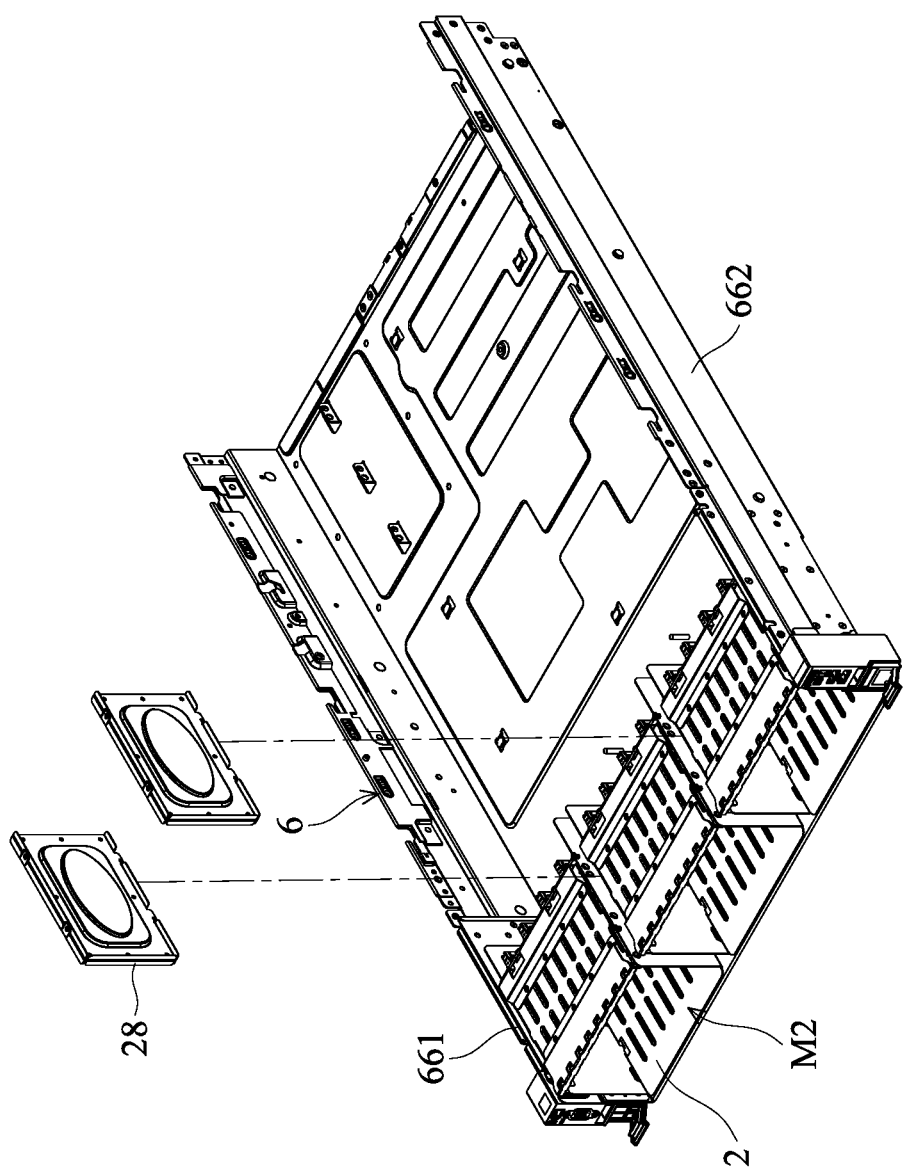
FIG. 6A shows the second connection module of the embodiment of the invention.

With reference to FIG. 1A, in this embodiment, the first brackets 1 receive the first storage units S1. The first storage units S1 are all 3.5" hard drives. However, the disclosure is not meant to restrict the invention. FIG. 5 shows the first connection module of a modified example of the invention. With reference to FIGS. 4B and 5, in this embodiment, the first brackets form a plurality of first receiving spaces R1 and a second receiving space R2. The storage units comprise a plurality of first storage units (not shown) and a second storage unit S2. The first storage units (not shown) are disposed in the first receiving spaces R1. The second storage unit S2 is disposed in the second receiving space R2. The size of the first receiving space R1 differs from the size of the second receiving space R2. In one embodiment, the first storage unit S1 is a 3.5" hard drive. The second storage unit S2 can be a 2.5" hard drive (S22) or an optical disk drive (S21). In this embodiment, the size of the second receiving space R2 is greater than the size of the first receiving space R1. The second receiving space R2 is formed by removing the spacer 12 (as shown in FIG. 4B). FIG. 6A shows the second connection module of the embodiment of the invention. With reference to FIG. 6A, in one embodiment, the second connection module M2 comprises a plurality of second brackets 2. The second brackets 2 are arranged side by side between the first side 661 and the second side 662 of the case 6. Particularly, the first brackets are stacked on top of each other, and the second brackets are arranged side by side.

Figure 6B:
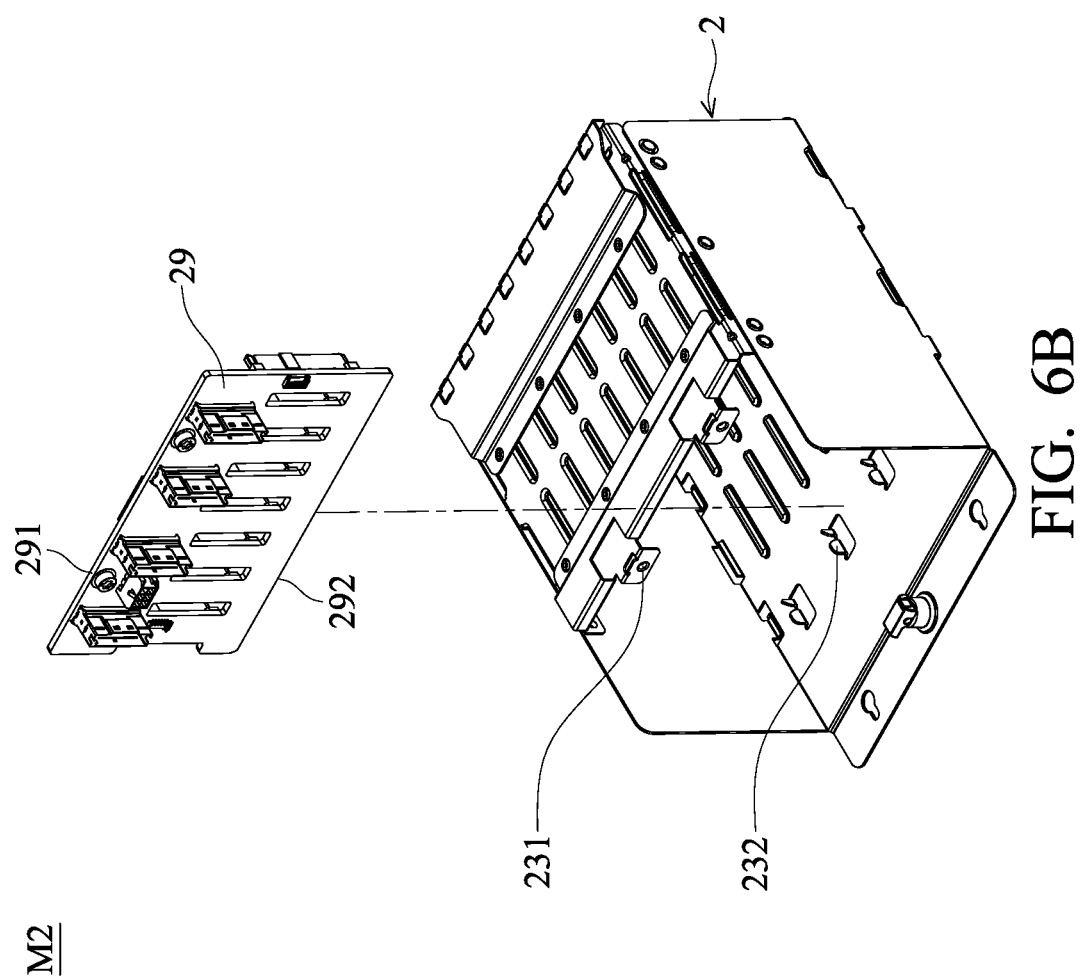
FIG. 6B is an exploded view of the second connection module of the embodiment of the invention.
Figure 6C:
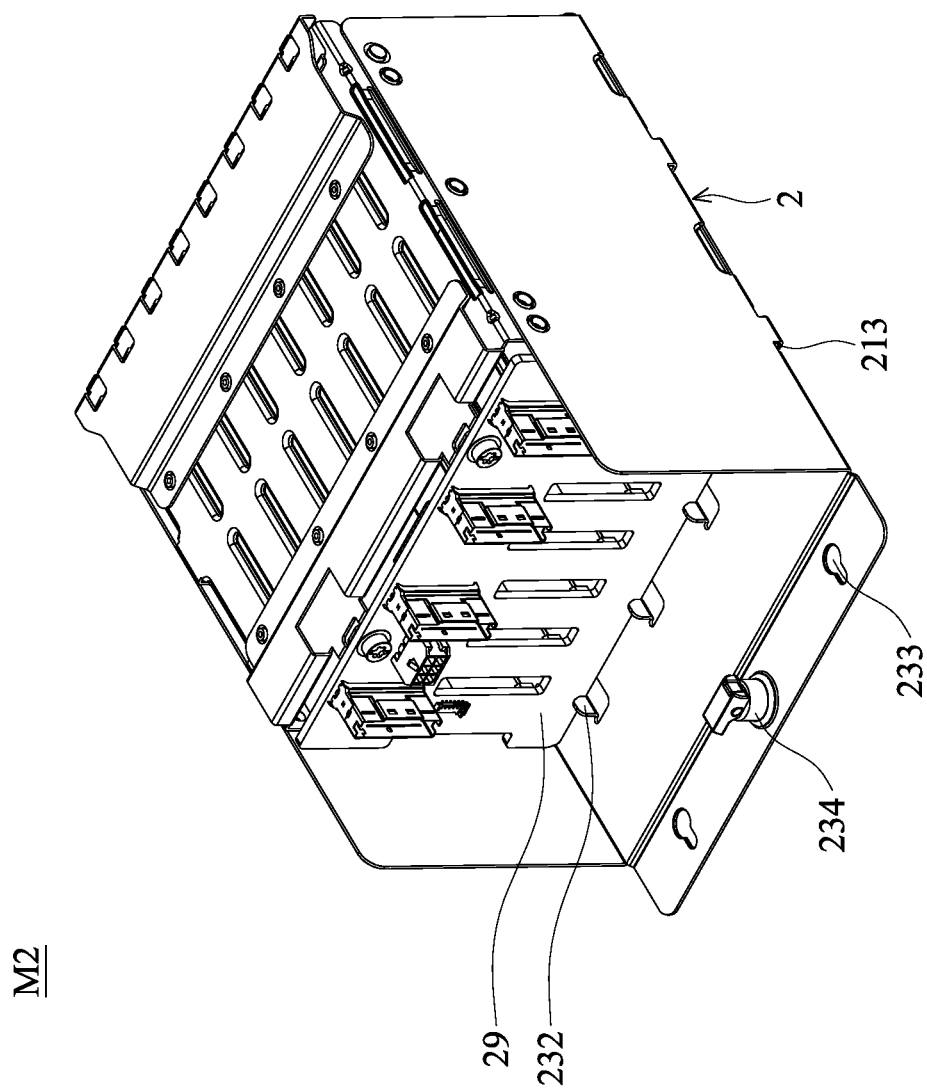
FIG. 6C is a perspective view of the second connection module of the embodiment of the invention.

FIG. 6B is an exploded view of the second connection module of the embodiment of the invention. FIG. 6C is a perspective view of the second connection module of the embodiment of the invention. With reference to FIGS. 6B and 6C, in one embodiment, the second connection module M2 further comprises a plurality of second back plates 29. Each second back plate 29 is connected to each second bracket 2. The third storage units are electrically connected to the second back plates 29.

With reference to FIGS. 6B and 6C, in one embodiment, each second bracket 2 comprises a second bracket fastening portion 231. Each second back plate 29 comprises a second plate fastening portion 291. The second bracket fastening portion 231 is affixed to the second plate fastening portion 291.

With reference to FIGS. 6B and 6C, in one embodiment, each second bracket 2 comprises a second bracket restriction portion 232. One edge 292 of each second back plate 29 is restricted by the second bracket restriction portion 232.

Figure 6D:
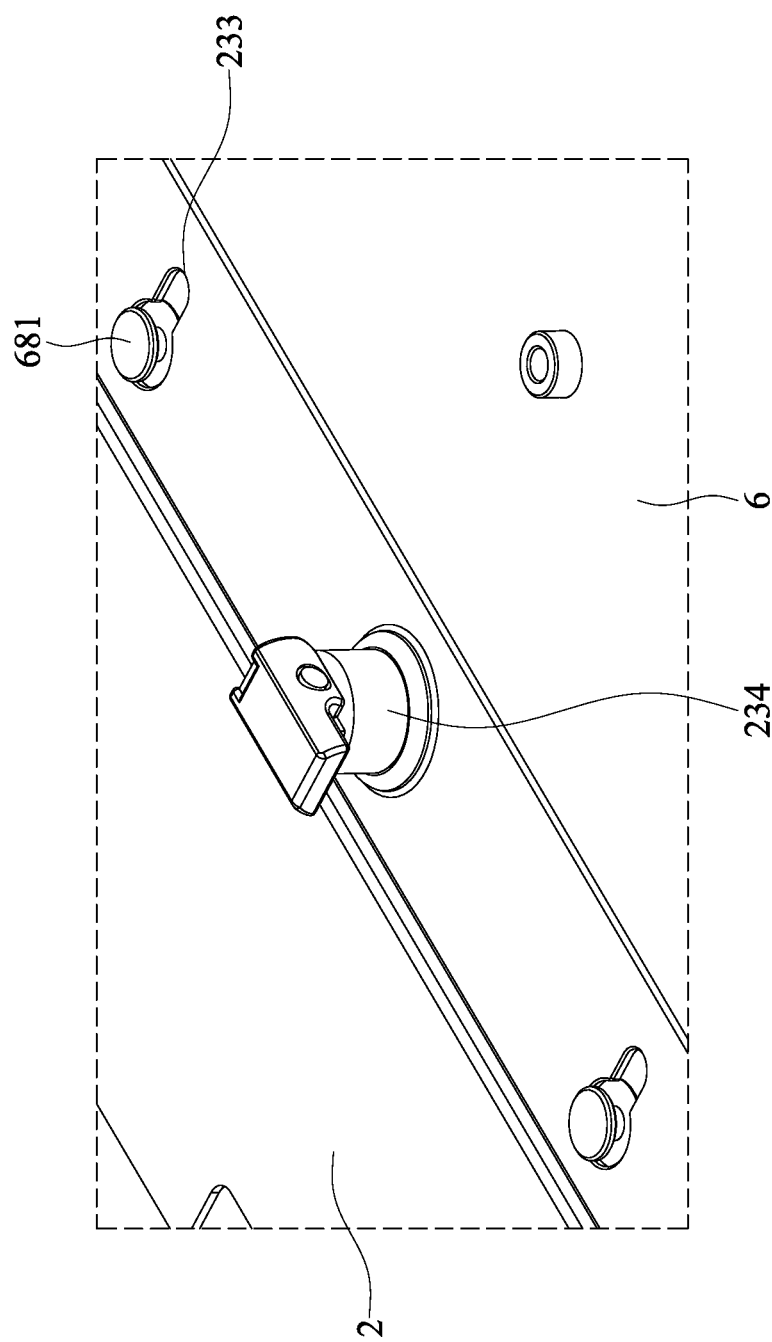
FIG. 6D shows the details of the second bracket of the embodiment of the invention.

FIG. 6D shows the details of the second bracket of the embodiment of the invention. With reference to FIGS. 6C and 6D, in one embodiment, each second bracket 2 comprises a bracket guiding groove 233 and a second moveable latch 234. The case 6 comprises a case guiding post 681 and a second case positioning hole 682 (with reference to FIG. 4A). The case guiding post 681 is adapted to pass through the bracket guiding groove 233. The second moveable latch 234 is adapted to be inserted into the second case positioning hole 682 to position the second bracket.

With reference to FIGS. 4A and 6C, in one embodiment, the case 6 comprises a second case connection slot 612. The second case connection slot 612 is located between the case lateral slots 613. Each second bracket 2 comprises two second lateral hooks 213, which are connected to the first side 661 or the second side 662 of the case 6. The second lateral hooks 213 of one single second bracket 2 are adapted to be connected to one of the case lateral slots 613 and the second case connection slot 612. In another embodiment, the case 6 comprises a plurality of second case connection slots 612. The second case connection slots 612 are located between the case lateral slots 613. Each second bracket 2 comprises two second lateral hooks 213, which are connected to the first side 661 or the second side 662 of the case 6. The second lateral hooks 213 of one single second bracket 2 are adapted to be connected to one of the case lateral slots 613 and one of the second case connection slots 612. The second lateral hooks 213 of one single second bracket 2 are also adapted to be connected to two of the second case connection slots 612, which are not connected to the first side 661 and the second side 662 of the case 6.

Figure 7A:
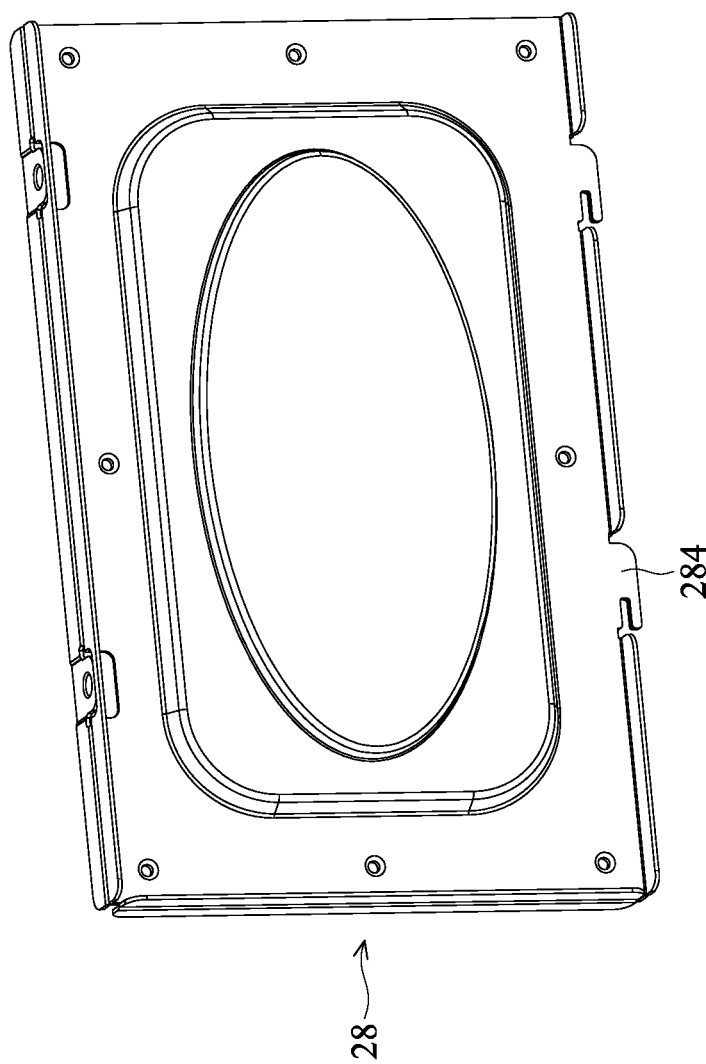
FIG. 7A shows a spacer of the embodiment of the invention.

FIG. 7A shows a spacer of the embodiment of the invention. With reference to FIGS. 4A, 6A and 7A, in one embodiment, the second connection module M2 further comprises a spacer 28. The case 6 further comprises a third case connection slot 614. In another embodiment, the second connection module M2 further comprises a plurality of spacers 28. The spacers are disposed between the second brackets 2. Each spacer 28 comprises a second connection hook 284. The second connection hook 284 is connected to the third case connection slot 614. The spacer 28 fills up the gap between the second brackets 2, and the structural strength of the electronic device is improved.

FIG. 7B shows a second cover of the embodiment of the invention. With reference to FIG. 7B, in one embodiment, the second connection module M2 further comprises a second cover 27. The second cover 27 covers the second brackets 2. The second cover 27 is affixed to the spacer 28 and the case 6.

With reference to FIGS. 1B and 7B, in one embodiment, each second bracket 2 has a third receiving space R3. A plurality of third storage units S3 are disposed in the third receiving space R3. In one embodiment, the third storage units S3 can be solid state drives. In this embodiment, the third storage units S3 can be SFF (Small Form Factor) solid state drives.

Figure 8:
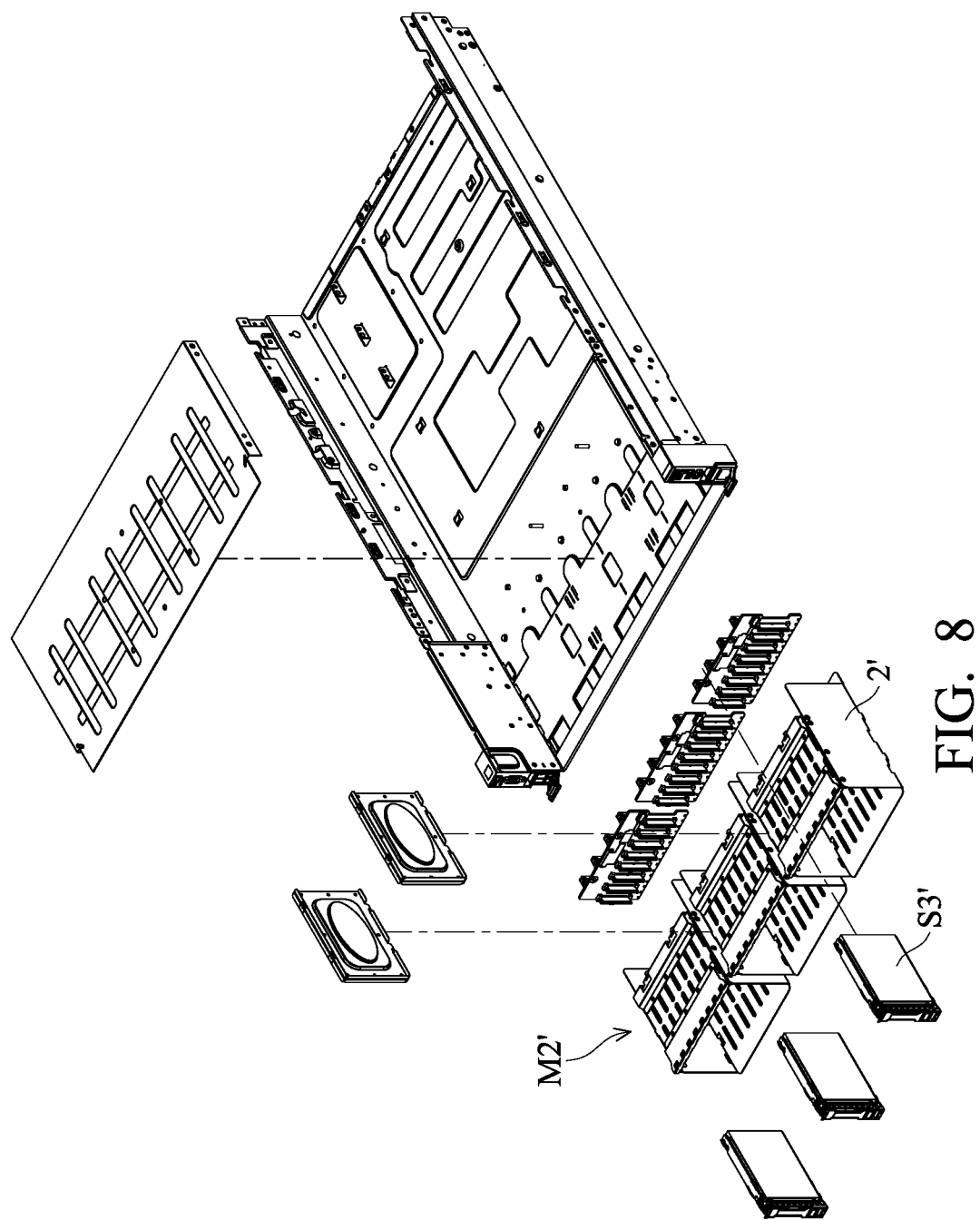
FIG. 8 shows the second connection module of another embodiment of the invention.

FIG. 8 shows the second connection module of another embodiment of the invention. With reference to FIG. 8, in another embodiment, the second connection module M2' comprises a plurality of second brackets 2'. The second brackets 2' have increased height. The second brackets 2' are adapted to receive the third storage units S3'. The third storage units S3' can be the EDSFF (Enterprise & Data Small Form Factor) solid state drives.

In the embodiment of the invention, one single case is combined with the first brackets and the second brackets of different design to selectively receive the different storage units such as the 3.5" hard drives, the 2.5" hard drives, the optical disk drives, the SFF (Small Form Factor) solid state drives and the EDSFF (Enterprise & Data Small Form Factor) solid state drives. Therefore, the molding manufacturing cost of the case is decreased, the product (electronic device, for example, server) can utilize different storage units unrestrictedly, and the product competitiveness is improved.

Figure 9A:
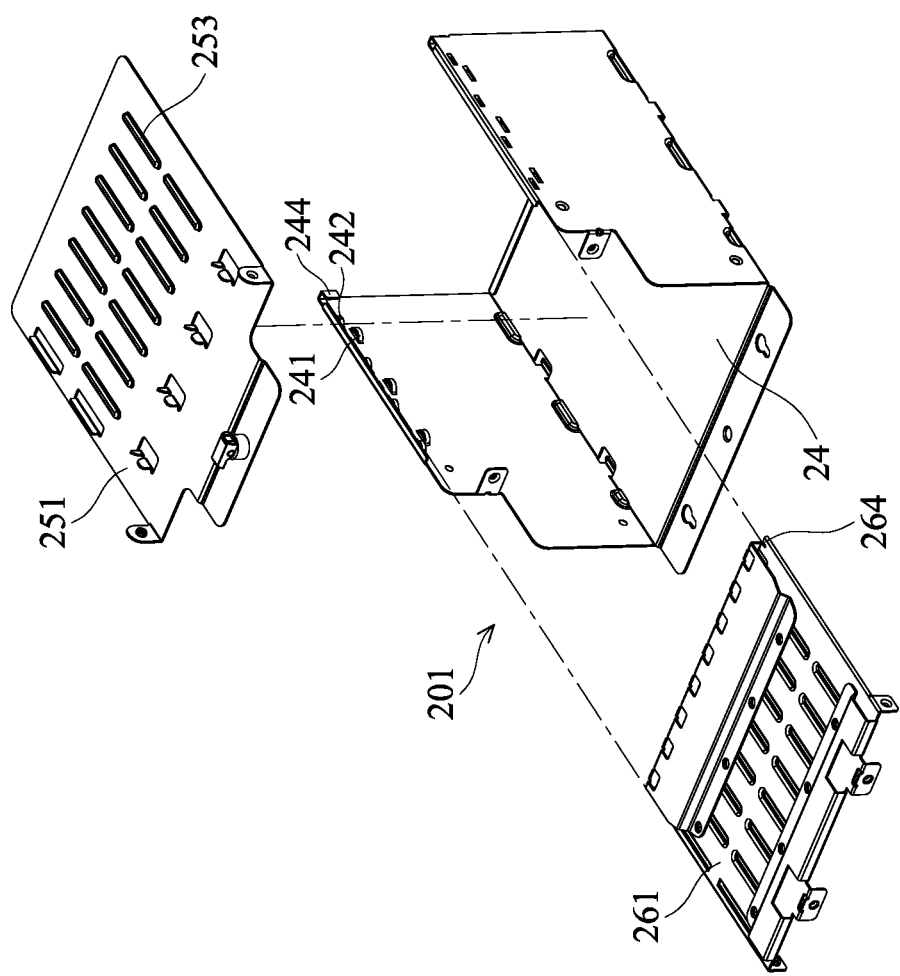
FIG. 9A is an exploded view of the second bracket of another embodiment of the invention.
Figure 9B:
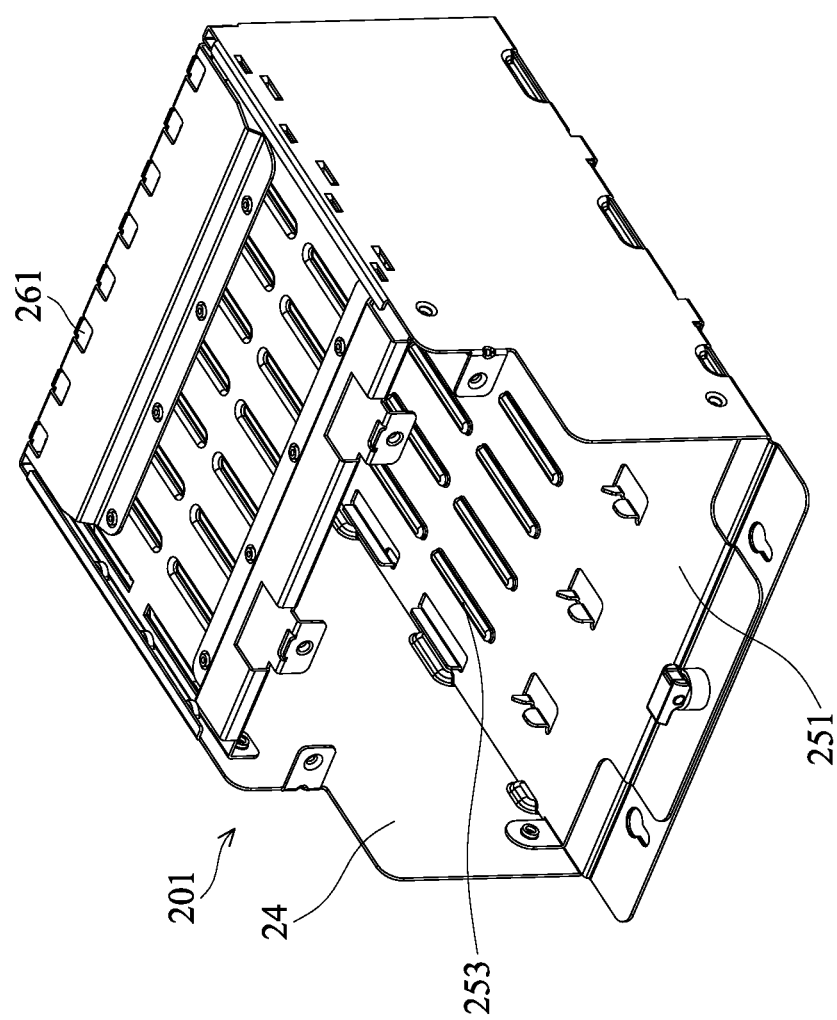
FIG. 9B is an assembled view of the second bracket of another embodiment of the invention.
Figure 9C:
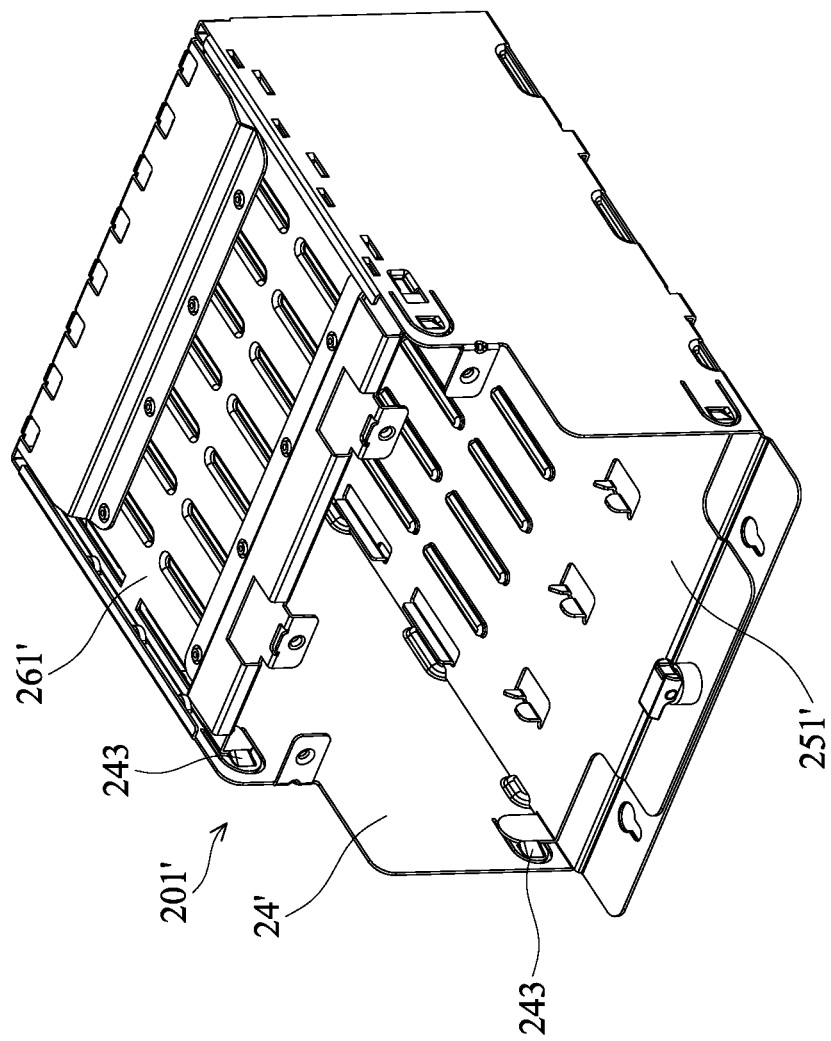
FIG. 9C shows the second bracket of a modified example of the invention.

FIG. 9A is an exploded view of the second bracket of another embodiment of the invention. FIG. 9B is an assembled view of the second bracket of another embodiment of the invention. With reference to FIGS. 9A and 9B, in one embodiment, the second bracket 201 comprises a bracket body 24, a first moveable plate 251 and a first moveable cover 261. The first moveable plate 251 comprises a first rib 253. The storage units (not shown) are disposed between the first moveable plate 251 and the first moveable cover 261, and are separated by the first rib 253. With reference to FIGS. 9A-9C, the first moveable plate 251 comprises at least one first rib 253. The bracket body 24 comprises a first sliding groove 241 and a second sliding groove 242. The height of the first sliding groove 241 differs from that of the second sliding groove 242. The first moveable cover 261 is connected to the first sliding groove 241 of the bracket body 24 and is corresponding to the first moveable plat 251. The third storage units (not shown) are disposed between the first moveable plate 251 and the first moveable cover 261, and are held apart by the first rib 253, In other one embodiment, The first moveable cover 261 is connected to the second sliding groove 242 of the bracket body 24 and is corresponding to the first moveable plat 251. The other size with different height of third storage units (not shown) are disposed between the first moveable plate 251 and the first moveable cover 261, and are held apart by the first rib 253.

With reference to FIGS. 9A and 9B, in this embodiment, the first moveable cover 261 and the first moveable plate 251 are affixed to the bracket body 24 by bolts. However, the disclosure is not meant to restrict the invention. FIG. 9C shows the second bracket of a modified example of the invention. With reference to FIG. 9C, in this embodiment, the first moveable cover 261' and the first moveable plate 251' are affixed to the bracket body 24' by hooks. Particularly, the bracket body 24' of the second bracket 201' has elastic hooks 243. The elastic hooks 243 are adapted to be wedged against the first moveable cover 261' and the first moveable plate 251'. The elastic hook 243 on the top of the bracket body 24' is wedged against the first moveable cover 261', and the elastic hook 243 on the bottom of the bracket body 24' is wedged against the first moveable plate 251'.

With reference to FIGS. 9A and 9B, in one embodiment, the bracket body 24 comprises two restriction portions 244 (both sides). The first moveable cover 261 comprises two notches 264 (both sides). The restriction portions 244 are adapted to be waged against the notches 264 to restrict the first moveable cover 261.

Figure 10A:
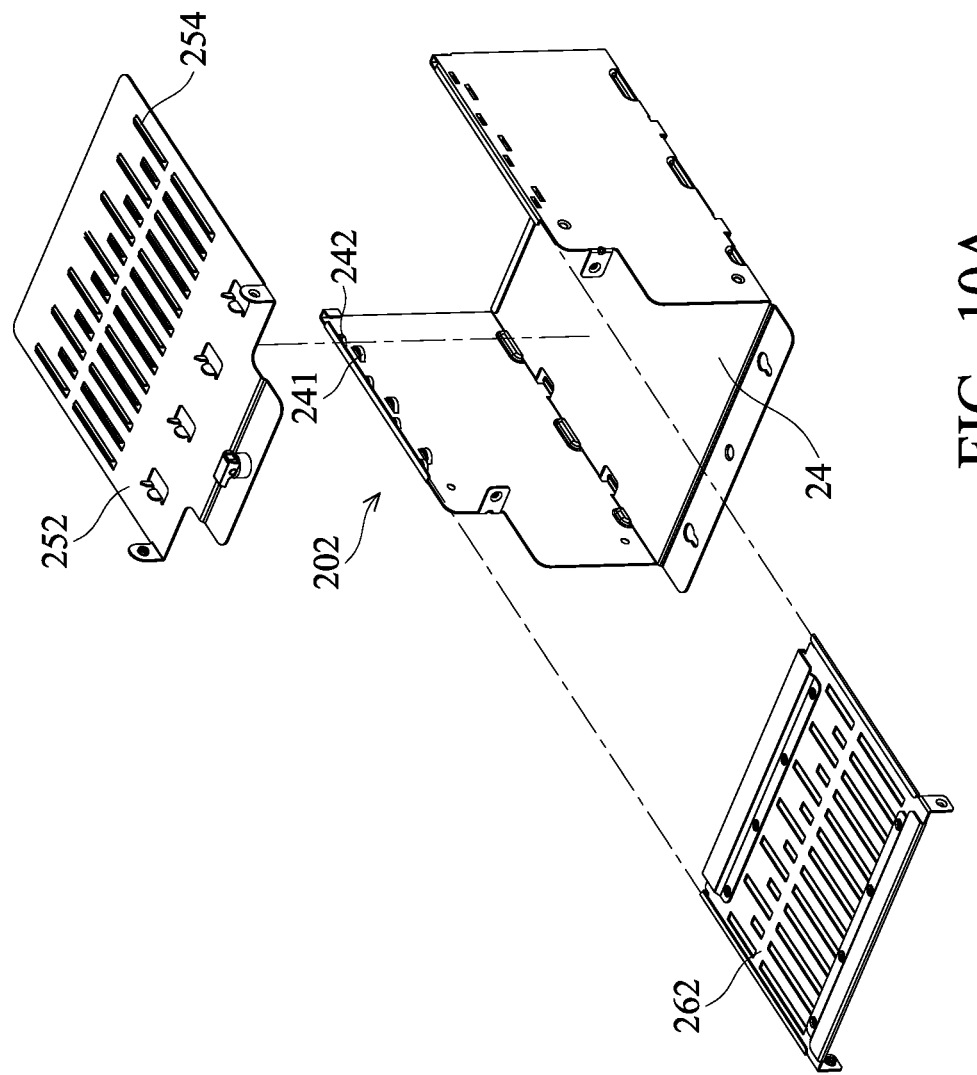
FIG. 10A is an exploded view of the second bracket of further another embodiment of the invention.
Figure 10B:
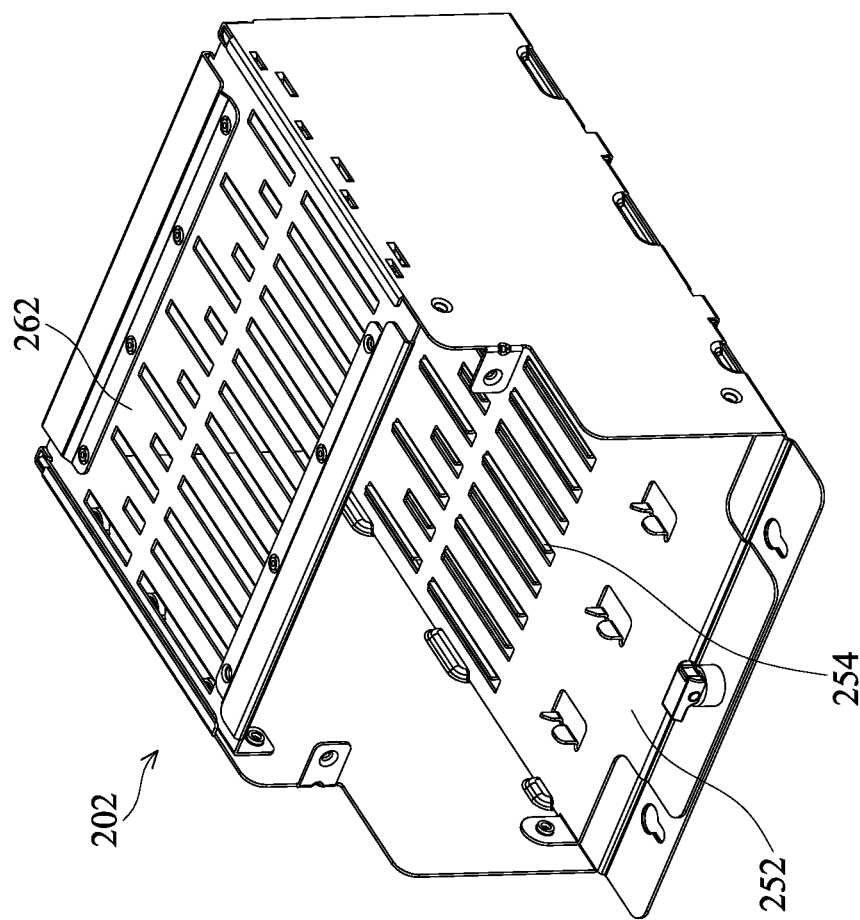
FIG. 10B is an assembled view of the second bracket of further another embodiment of the invention.

FIG. 10A is an exploded view of the second bracket of further another embodiment of the invention. FIG. 10B is an assembled view of the second bracket of further another embodiment of the invention. With reference to FIGS. 10A and 10B, in one embodiment, the second bracket 202 comprises a bracket body 24, a second moveable plate 252 and a second moveable cover 262. The second moveable plate 252 comprises a second rib 254. In another embodiment, the second bracket 202 comprises a bracket body 24, a second moveable plate 252 and a second moveable cover 262. The second moveable cover 262 is connected to the first sliding groove 241 of the bracket body 24 and is corresponding to the second moveable plate 252. The fourth storage units (not shown) are disposed between the second moveable plate 252 and the second moveable cover 262, and are held apart by the second ribs 254. In one embodiment, the second bracket 202 comprises a bracket body 24, a second moveable plate 252 and a second moveable cover 262. The second moveable cover 262 is connected to the second sliding groove 242 of the bracket body 24 and is corresponding to the second moveable plate 252. The other size with different height of fourth storage units (not shown) are disposed between the second moveable plate 252 and the second moveable cover 262, and are held apart by the second ribs 254.

In the embodiment of the invention, one single bracket body is combined with the moveable plates and the moveable covers of different design to selectively receive the different storage units. Therefore, the molding manufacturing cost of the bracket body is decreased. For example, in the embodiment of FIGS. 9A and 9B, the second bracket 201 can receive the SFF (Small Form Factor) solid state drives (the third storage units). In the embodiment of FIGS. 10A and 10B, the second bracket 202 can receive the EDSFF (Enterprise & Data Small Form Factor) solid state drives (the fourth storage units).

In the embodiment of the invention, the number of the slots (for example, the first plate slot 191, the case lateral slots 613 or the first case connection slot 611) can be modified. For example, there can be only one first plate slot 191, or can be a plurality of first plate slots 191. The disclosure is not meant to restrict the invention. Commonly, the increased number of the first plate slots 191 can provide improved structural strength.

In the embodiment of the invention, the number of the first cover lateral slot 143, the second lateral hook 213, the restriction portion 244, the notch 264 can be only one. The disclosure is not meant to restrict the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
   a first connection module, comprising a plurality of first brackets, wherein the first brackets are stacked in a first direction;
   a second connection module, comprising a plurality of second brackets, wherein the second brackets are arranged side by side in a second direction, and the first direction is perpendicular to the second direction; and
   a case, selectively connected to the first connection module or the second connection module.

2. The electronic device as claimed in claim 1, wherein the case comprises two lateral case slots, a first case connection slot and a plurality of second case connection slots, and when the first connection module is connected to the case, the first connection module is connected to the lateral case slots and the first case connection slot, and when the second connection module is connected to the case, the second connection module is connected to the lateral case slots and the second case connection slots.

3. An electronic device, comprising:
   a case;
   a connection module, detachably connected to the case; and
   a storage unit, disposed in the connection module and electrically connected to the connection module, wherein the storage unit is selectively connected to the connection module in a first direction or a second direction,
   wherein the connection module comprises a plurality of first brackets, the case comprises a first side and a second side, each first bracket extends from the first side to the second side, the first brackets are affixed to the case, the storage unit is disposed in the first brackets, the first brackets are stacked in a perpendicular direction.

4. The electronic device as claimed in claim 3, wherein the connection module further comprises a plurality of first back plates, each first back plate is connected to each first bracket, and the storage unit is electrically connected to the first back plate.

5. The electronic device as claimed in claim 4, wherein each first bracket comprises a first bracket hook, each first back plate comprises a first plate slot, and the first bracket hook is wedged against the first plate slot.

6. The electronic device as claimed in claim 5, wherein each first bracket comprises a first bracket restriction portion, and one edge of each first back plate is restricted by the first bracket restriction portion.

7. The electronic device as claimed in claim 4, wherein each first bracket comprises a bracket protrusion and a first moveable latch, the first moveable latch is disposed on the bracket protrusion, the case comprises a case guiding groove and a first case positioning hole, the bracket protrusion slides in the case guiding groove, and the first moveable latch is inserted into the first case positioning hole.

8. The electronic device as claimed in claim 4, wherein the case comprises two case lateral slots and a first case connection slot, the first case connection slot is located between the case lateral slots, each first bracket comprises two first lateral hooks and a first connection hook, the first lateral hooks is connected to the case lateral slots, and the first connection hook is connected to the first case connection slot.

9. The electronic device as claimed in claim 8, wherein each first bracket comprises a first cover, two first cover lateral slots and a first cover connection slot are formed on the first cover, and when the first brackets are stacked on top of each other, the first lateral hooks is connected to the first cover lateral slots, and the first connection hook is connected to the first cover connection slot.

10. The electronic device as claimed in claim 4, wherein the first brackets form a plurality of first receiving spaces and a second receiving space, the storage units comprise a plurality of first storage units and a second storage unit, the first storage units are disposed in the first receiving spaces, the second storage unit is disposed in the second receiving space, and the size of the first receiving space differs from the size of the second receiving space.

11. An electronic device, comprising:
a case;
a connection module, detachably connected to the case; and
a storage unit, disposed in the connection module and electrically connected to the connection module, wherein the storage unit is selectively connected to the connection module in a first direction or a second direction, wherein the connection module comprises a plurality of second brackets, the case comprises a first side and a second side, and the second brackets are arranged side by side between the first side and the second side.

12. The electronic device as claimed in claim 11, wherein the connection module further comprises a plurality of second back plates, each second back plate is connected to each second bracket, and the storage units are electrically connected to the second back plates.

13. The electronic device as claimed in claim 12, wherein each second bracket comprises a second bracket fastening portion, each second back plate comprises a second plate fastening portion, and the second bracket fastening portion is affixed to the second plate fastening portion.

14. The electronic device as claimed in claim 12, wherein each second bracket comprises a bracket guiding groove and a second moveable latch, the case comprises a case guiding post and a second case positioning hole, the case guiding post passes through the bracket guiding groove, and the second moveable latch is inserted into the second case positioning hole.

15. The electronic device as claimed in claim 12, wherein the case comprises two case lateral slots and a plurality of second case connection slots, the second case connection slots are located between the case lateral slots, each second bracket comprises two second lateral hooks, the second lateral hooks of one single second bracket is connected to one of the case lateral slots and one of the second case connection slots, and the second lateral hooks of one single second bracket are also connected to two of the second case connection slots.

16. The electronic device as claimed in claim 15, wherein the connection module further comprises a spacer, the case further comprises a third case connection slot, the spacer is disposed between the second brackets, the spacer comprises a second connection hook, and the second connection hook is connected to the third case connection slot.

17. The electronic device as claimed in claim 12, wherein the second bracket comprises a bracket body, a first moveable plate and a first moveable cover, the storage units comprise a plurality of third storage units, the first moveable plate comprises a first rib, the bracket body comprises a first sliding groove and a second sliding groove, the height of the first sliding groove differs from the height of the second sliding groove, the first moveable cover is connected to the first sliding groove of the bracket body and is corresponding to the first moveable plate, and the third storage units are disposed between the first moveable plate and the first moveable cover, and are held apart by the first rib.

18. The electronic device as claimed in claim 12, wherein the second bracket comprises a bracket body, a second moveable plate and a second moveable cover, the storage units comprise a plurality of fourth storage units, the second moveable plate comprises a second rib, the bracket body comprises a first sliding groove and a second sliding groove, the height of the first sliding groove differs from the height of the second sliding groove, the second moveable cover is connected to the second sliding groove of the bracket body and is corresponding to the second moveable plate, and the fourth storage units are disposed between the second moveable plate and the second moveable cover, and are held apart by the second rib.

19. A bracket, comprising:
a first moveable plate;
a first moveable cover;
a second moveable plate;
a second moveable cover; and
a bracket body, comprising a first sliding groove and a second sliding groove, wherein the height of the first sliding groove differs from the height of the second sliding groove, the first sliding groove is connected to the first moveable cover, the second sliding groove is connected to the second moveable cover, the bracket body is selectively connected to the first moveable plate and the first moveable cover, or connected to the second moveable plate and the second moveable cover.

* * * * *